United States Patent
TG (12)

(10) Patent No.: US 6,268,999 B1
(45) Date of Patent: Jul. 31, 2001

(54) COMPUTER PERIPHERAL DEVICE WITH INTEGRAL GROUND CLIP

(75) Inventor: Sy Hien TG, San Jose, CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/060,456

(22) Filed: Apr. 14, 1998

(51) Int. Cl.[7] .................................................. H05K 5/00
(52) U.S. Cl. ........................ 361/686; 361/754; 361/741; 439/945
(58) Field of Search .................................... 361/686, 683, 361/681, 682, 680, 725–727, 741, 754, 756; 439/945, 946, 377

(56) References Cited

U.S. PATENT DOCUMENTS

| | | | |
|---|---|---|---|
| 5,445,525 | * 8/1995 | Broadbent et al. | 361/686 |
| 5,673,181 | * 9/1997 | Hsu | 361/760 |
| 5,807,137 | * 9/1998 | Janota et al. | 439/607 |
| 6,074,223 | * 6/2000 | Huang | 439/95 |

* cited by examiner

*Primary Examiner*—Leo P. Picard
*Assistant Examiner*—Hung Van Duong
(74) *Attorney, Agent, or Firm*—Wagner, Murabito & Hao LLP

(57) ABSTRACT

A computer peripheral device with an integral ground clip. In one embodiment, the present invention includes a substrate. The substrate has a ground signal receptacle location coupled thereto. The present embodiment further includes an enclosure which adapted to be coupled to the substrate. In this embodiment, the enclosure has a conductive region coupled thereto. The enclosure further includes a grounding member which is integral therewith. The grounding member is disposed such that the grounding member is electrically coupled to the ground signal receptacle location when the enclosure is assembled to the substrate. In so doing, the present invention provides a computer peripheral device which, among other benefits, effectively dissipates ground signals.

5 Claims, 10 Drawing Sheets

COMPUTER PERIPHERAL DEVICE WITH INTEGRAL GROUND CLIP

TECHNICAL FIELD

This invention pertains to computer peripheral devices. More specifically, the present invention pertains to an apparatus and method for dissipating ground signals in order to control the level of electromagnetic interference emissions generated by computer communications I/O devices, such as PC (personal computer) cards and compact flash cards.

BACKGROUND ART

Computer peripheral devices, such as Local Area Network (LAN) or modem Personal Computer (PC) Cards perform input/output (I/O) communications functions in portable computers. These computer peripheral devices, generate some level of electromagnetic interference (EMI) emissions during data transmission. The permissible level of EMI is strictly regulated by national or regional regulatory bodies. For instance, in the U.S., any portable computer or handheld computer used in a home environment may only use a PC card which meets FCC Class B standards for EMI. In Europe, the corresponding requirement is the CE standard.

The ability of a LAN or modem I/O card to meet the proscribed EMI levels is directly related to effectiveness with which ground signals are dissipated from the I/O card during active LAN or modem data transmissions. In PC cards, the PCMCIA (personal computer memory card international association) industry standard allocates and designates 4 pins out of a total of 68 interface pins as ground signal pins.

In one prior art approach, even 4 pins prove inadequate to sufficiently dissipate the ground signals, thereby requiring manufacturers to add a bulky ferrite core externally to the I/O cable used in conjunction with the PC Card, to limit EMI to the required levels. This method adds cost and bulk to the PC Card, and is aesthetically displeasing to the end-user.

In another prior art approach, in addition to using the 4 pins available for ground signals, some manufacturers use a complicated arrangement of individual and separate ground clips, which are then assembled onto the card frame to provide additional grounding paths from the I/O card through the host computer. Assembly of these clips onto the card frame requires time-consuming, multi-step manual operations. Such extensive manual labor results in a more costly finished product. The manual assembly process is also prone to wide variation in skill level among individual manual assemblers, and results in inconsistent quality of finished product, as regards effectiveness in meeting regulatory EMI limits.

In yet another attempt to control the EMI levels generated in PC Cards, other manufacturers, in addition to using the 4 pins designated, use metal tabs on the top surface of the 15 pin I/O connector at the I/O end of the card. This arrangement is intended to provide an additional grounding path from the card circuitry, through the metal tabs being in direct contact with the metal covers of the card, which in turn are electrically connected to a grounding signal path on the host computer. However, the location of such metal tabs at that I/O end of the card results in the tabs being continually subjected to compressive forces during user insertion and removal of the card into the host computer PC Card slot. These repeated cycles of compressive forces result in the metal tabs being permanently deformed after only a few hundred cycles of usage, so that they are no longer in contact with the metal cover of the card, and this feature ceases to function as a grounding path. Thus, a PC card which might meet EMI regulatory requirements upon shipment of the product to a customer, gets progressively worse when used as intended.

As handheld computers, which are even smaller than portable computers, become more widespread, users will increasingly have a need for correspondingly smaller I/O cards to handle LAN and modem communications functions. Currently, the Compact Flash Card is a relatively newer form factor which is about one-third the overall size of a PC card. The Compact Flash Association has allocated and designated 2 pins out of a total of 50 interface pins as ground signal pins. For LAN or modem I/O cards having a Compact Flash form factor, it will be practically impossible, or extremely difficult at least to meet FCC Class B and CE regulatory requirements during active data transmission, when only the allocated 2 pins are available as ground signal pins.

Therefore, a need exists for a computer communications I/O device structure that will effectively dissipate ground signals while not requiring more than two interface pins dedicated to ground signals. A further need exists for a computer communications I/O device structure which effectively dissipates ground signals wherein the device does not require costly, labor intensive, manual operations which are likely to result in widely varying finished product quality, in terms of EMI effectiveness. Still another need exists for a computer communications I/O device structure which effectively dissipates ground signals, and in which the effectiveness of any ground signal paths used does not degrade relatively rapidly with time, and wherein the device does not violate EMI regulatory requirements when used as intended.

DISCLOSURE OF THE INVENTION

The present invention provides a computer communications I/O device structure to effectively dissipate ground signals that does not require more than 2 interface pins dedicated to ground signals. The present invention further provides a computer communications I/O device structure to effectively dissipate ground signals that does not require costly, labor intensive manual operations that are likely to result in widely varying finished product quality, in terms of EMI effectiveness. Additionally, the present invention provides a computer communications I/O device structure which effectively dissipates ground signals, and in which the effectiveness of any ground signal paths used does not degrade relatively rapidly with time, and wherein the device does not violate EMI regulatory requirements when the device is used as intended. The present invention achieves the above accomplishments with a computer peripheral device with an integral ground clip.

Specifically, in one embodiment, the present invention includes a substrate. The substrate has a ground signal receptacle location coupled thereto. The present embodiment further includes an enclosure which adapted to be coupled to the substrate. In this embodiment, the enclosure has a conductive region coupled thereto. The enclosure further includes a grounding member which is integral therewith. The grounding member is disposed such that the grounding member is electrically coupled to the ground signal receptacle location when the enclosure is assembled to the substrate. In so doing, the present invention provides a computer peripheral device which, among other benefits, effectively dissipates ground signals.

In another embodiment, the present invention includes the features of the above-described embodiment and further recites a plurality of ground receptacle locations and a plurality of grounding members wherein the plurality of grounding members are integral with the enclosure. The plurality of grounding members are disposed such that each of the plurality of the grounding members is electrically coupled to a respective one of the plurality of the ground signal receptacle locations when the enclosure is assembled to the substrate.

In yet another embodiment, the present invention includes the features of the first above described embodiment and further includes a second enclosure. In such an embodiment, the second enclosure is adapted to be coupled to the substrate. The second enclosure has at least a second conductive region coupled thereto. The second enclosure further comprises a second grounding member integral with the second enclosure. The second grounding member is disposed such that the second grounding member is electrically coupled to the ground signal receptacle location when the second enclosure is assembled to the substrate.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
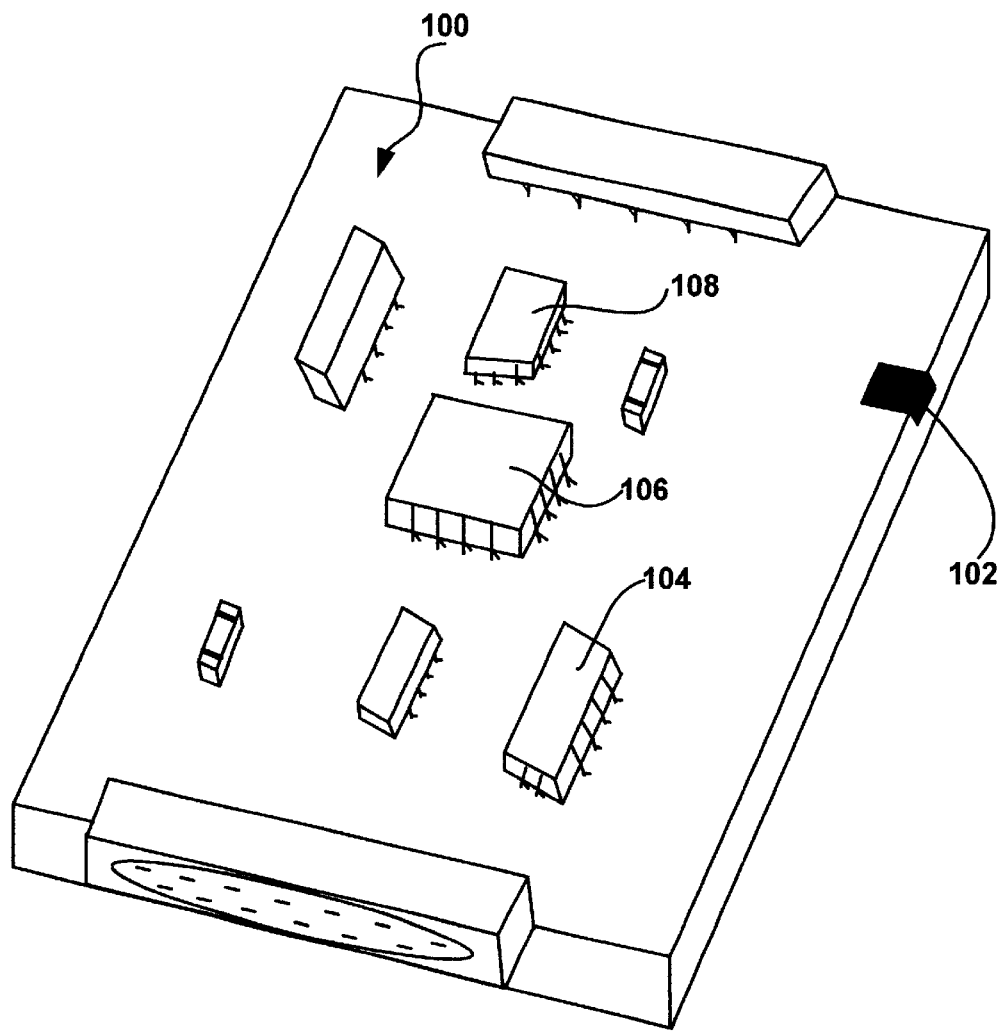
FIG. 1 is a perspective view of a substrate having ground signal receptacle location adapted for use with an enclosure having an integral grounding member in accordance with one embodiment of the present invention.

With reference now to FIG. 1, a perspective view of a substrate 100 of one embodiment of the present invention is shown. As will be described in detail below, the present invention pertains to an apparatus and method for effectively dissipating ground signals from a computer peripheral device. In the present application, computer peripheral devices will be understood to include, but not be limited to, PCMCIA cards, Network Interface Cards (NICs), LAN cards, WAN cards, Flash memory cards, Compact Flash Cards, compact form factor computer communications I/O cards, and the like.

With reference still to FIG. 1, in the present embodiment, substrate 100 is comprised of a printed circuit board. However, the present embodiment is well suited to having substrate 100 comprised of numerous other materials or structures. In the embodiment of FIG. 1, substrate 100 has a ground signal receptacle location 102 coupled thereto. Ground signal receptacle location 102 is a conductive area such as, for example, a conductive pad which is electrically coupled to any one or more of various ground signal connections present in various components (e.g. 104, 106, and 108) disposed on substrate 100. As mentioned above, it is desired to dissipate such ground signals in many computer peripheral devices. The components (e.g. 104, 106, and 108) disposed on substrate 100 perform the requisite tasks needed to create an operational computer peripheral device. In the present embodiment, ground signal receptacle location 102 is formed of copper. It will be understood, however, that the present invention is well suited to having ground signal receptacle location 102 formed of various other conductive materials. Additionally, in the present embodiment, ground signal receptacle location 102 is disposed near the edge of substrate 100. Although such a placement of ground signal receptacle location 102 is shown in the present embodiment, the present invention is also well suited to having ground signal receptacle location 102 disposed at various other locations on substrate 100.

Figure 2:
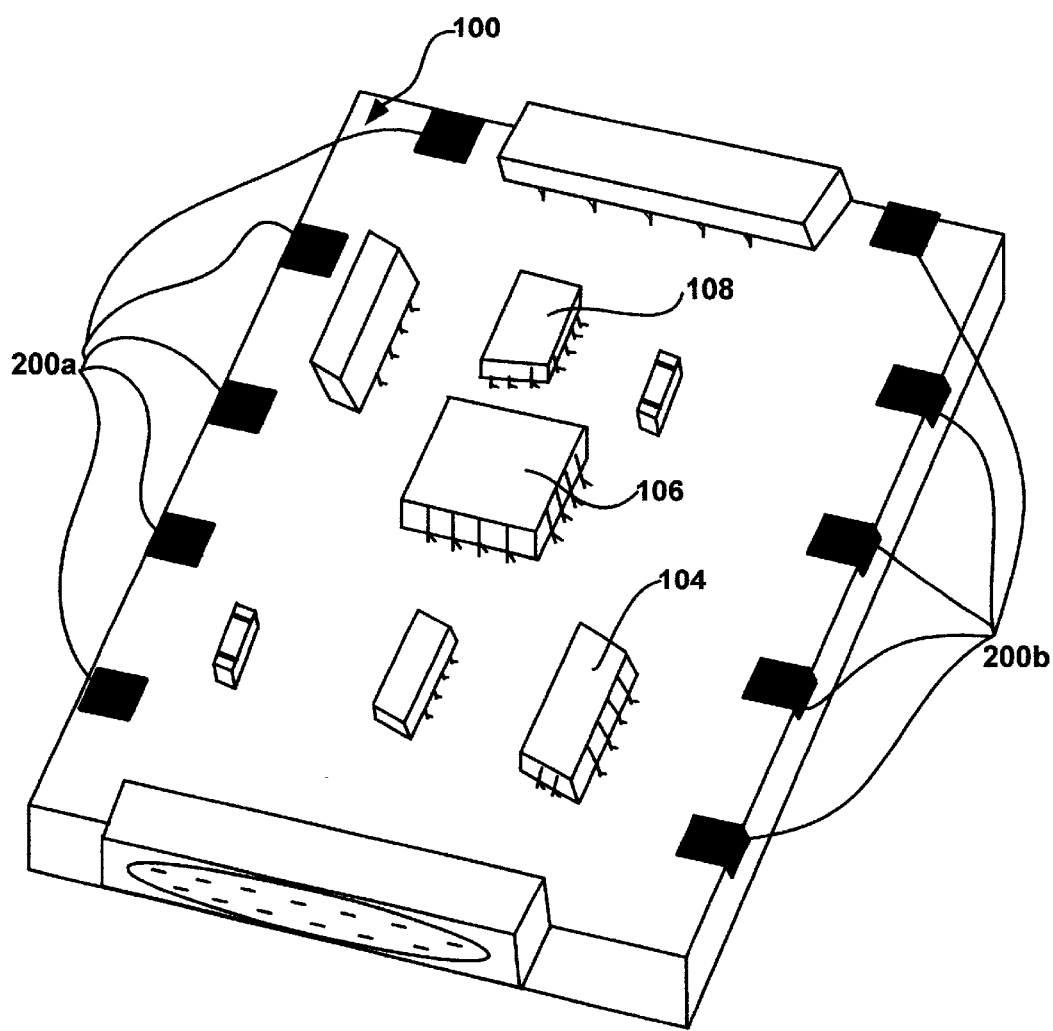
FIG. 2 is a perspective view of a substrate having multiple ground signal receptacle locations adapted for use with an enclosure having an integral grounding member in accordance with one embodiment of the present invention.

With reference next to FIG. 2, another embodiment of substrate 100 of one embodiment of the present invention is shown. In the embodiment of FIG. 2, multiple ground signal receptacle locations, 200a and 200b, are coupled to substrate 100. As in the embodiment of FIG. 1, ground signal receptacle locations 200a and 200b are comprised of conductive areas such as, for example, conductive pads which are electrically coupled to any one or more of various ground signal connections present in various components (e.g. 104, 106, and 108) disposed on substrate 100. Again, it is desired to dissipate such ground signals in many computer peripheral devices. In this present embodiment, ground signal receptacle locations 200a and 200b are formed of copper. It will be understood, however, that the present invention is well suited to having ground signal receptacle locations 200a and 200b formed of various other conductive materials. Additionally, in the present embodiment, ground signal receptacle locations 200a and 200b are disposed near the edge of substrate 100. Although such a placement of ground signal receptacle locations 200a and 200b is shown in the present embodiment, the present invention is also well suited to having ground signal receptacle locations 200a and 200b disposed at various other locations on substrate 100.

Figure 3:
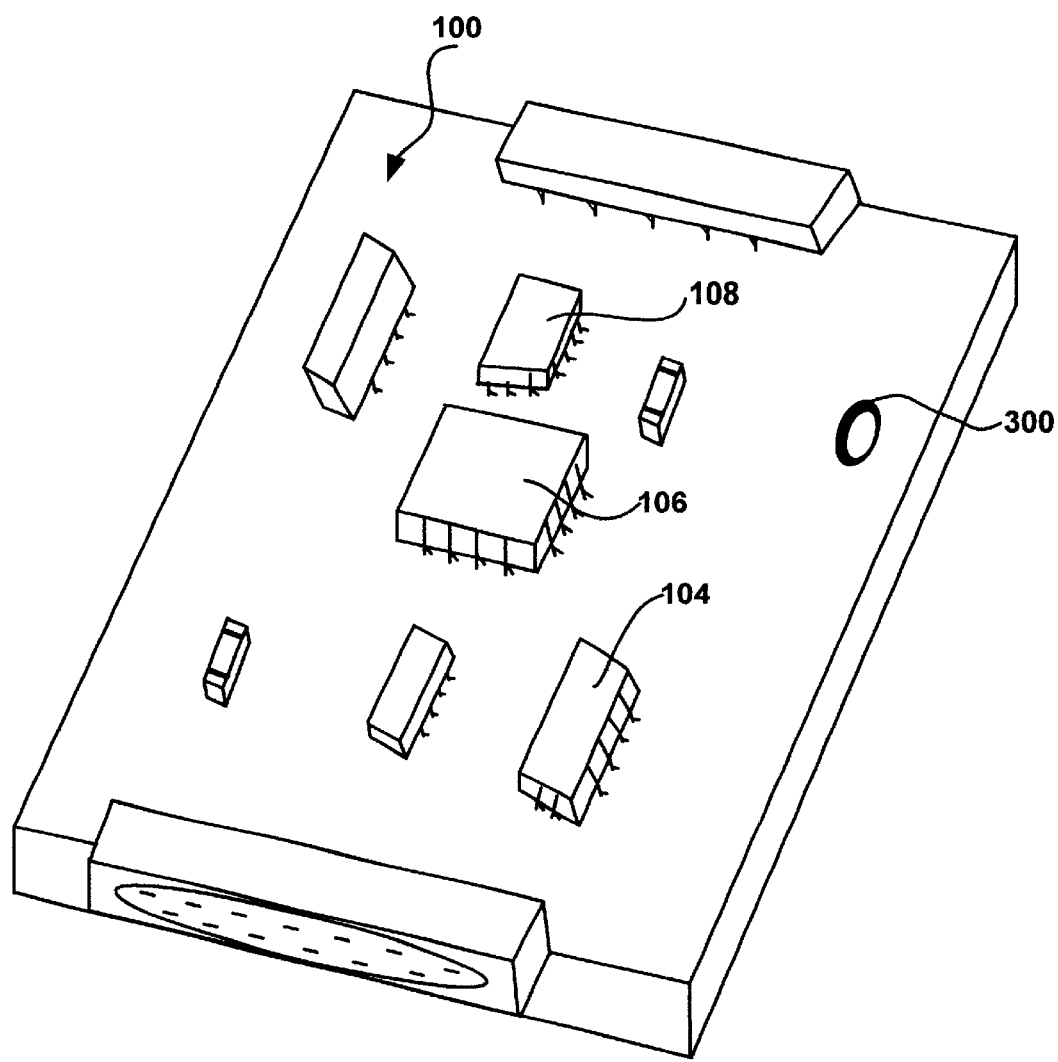
FIG. 3 is a perspective view of a substrate having a through-hole ground signal receptacle location adapted for use with an enclosure having an integral grounding member in accordance with one embodiment of the present invention.

Referring now to FIG. 3, another embodiment of substrate 100 of another embodiment of the present invention is shown. In the present embodiment, substrate 100 has a ground signal receptacle location 300 coupled thereto. Ground signal receptacle location 300 is comprised of a through-hole which is electrically coupled to any one or more of various ground signal connections present in various components (e.g. 104, 106, and 108) disposed on substrate 100. Once more, it is desired to dissipate such ground signals in many computer peripheral devices. In the present embodiment, through-hole ground signal receptacle location 300 is formed of copper. It will be understood, however, that the present invention is well suited to having through-hole ground signal receptacle location 300 formed of various other conductive materials. Additionally, in the present embodiment, through-hole ground signal receptacle location 300 is disposed near the edge of substrate 100. Although such a placement of through-hole ground signal receptacle location 300 is shown in the present embodiment, the present invention is also well suited to having through-hole ground signal receptacle location 300 disposed at various other locations on substrate 100.

Figure 4:
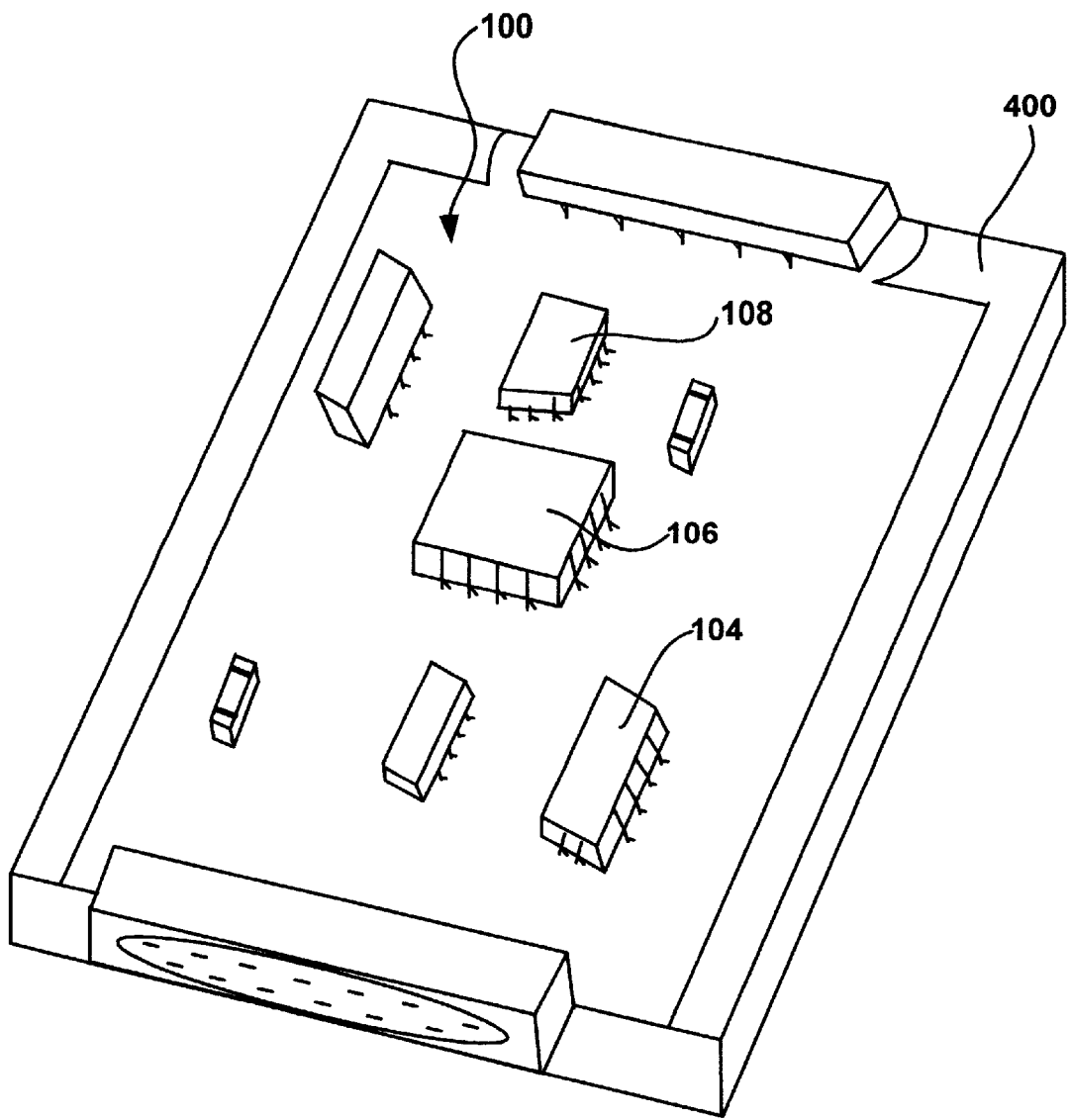
FIG. 4 is a perspective view of a substrate having a ground signal receptacle location disposed along the edge of the substrate in accordance with one embodiment of the present invention.

With reference now to FIG. 4, still another embodiment of a substrate 100 of yet another embodiment of the present invention is shown. In the present embodiment, substrate 100 has a ground signal receptacle location 400 coupled thereto. In this embodiment, ground signal receptacle location 400 is comprised of conductive area which is disposed among the outer edges of substrate 100. Edge-oriented ground signal receptacle location 400 is electrically coupled to any one or more of various ground signal connections present in various components (e.g. 104, 106, and 108) disposed on substrate 100. As mentioned above, it is desired to dissipate such ground signals in many computer peripheral devices. In the present embodiment, edge-oriented ground signal receptacle location 400 is formed of copper. It will be understood, however, that the present invention is well suited to having edge-oriented ground signal receptacle location 400 formed of various other conductive materials.

Figure 5:
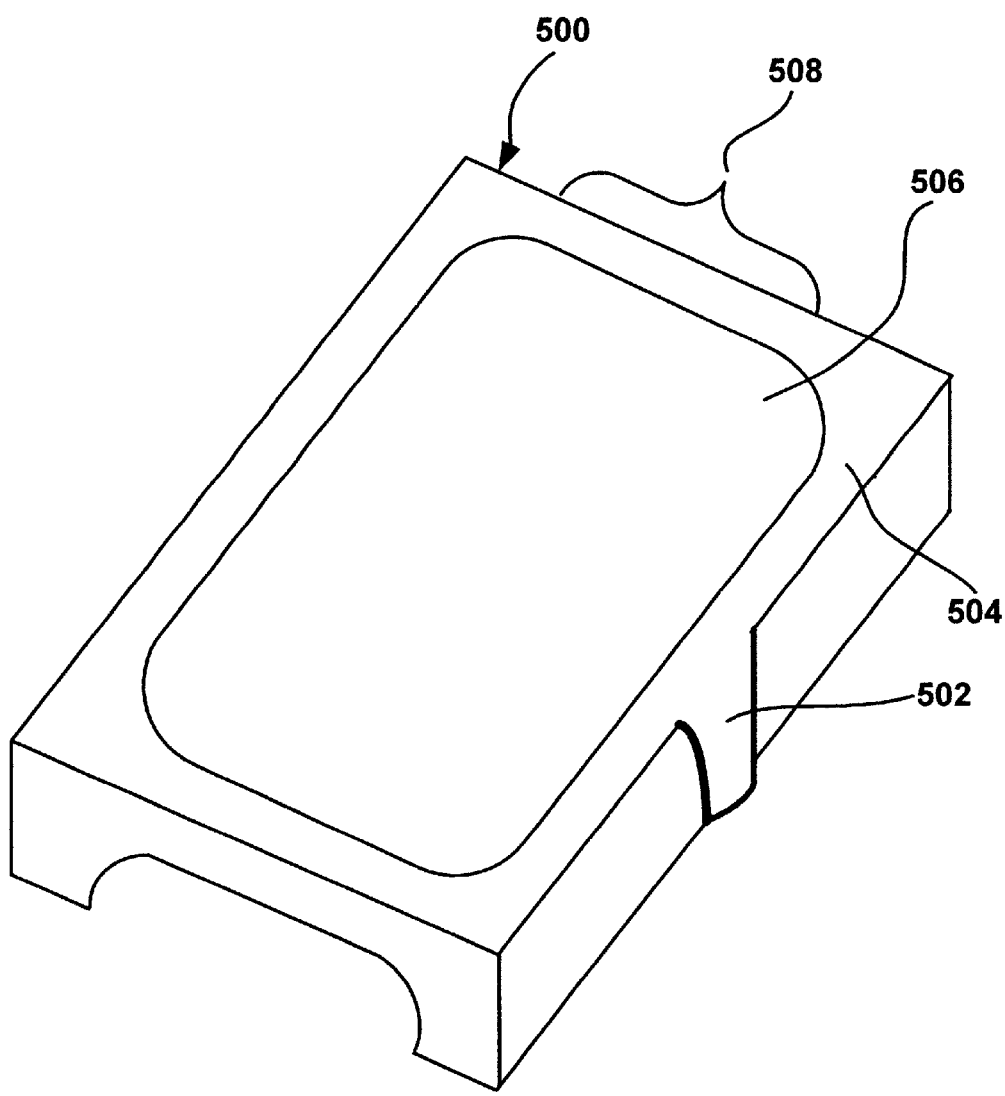
FIG. 5 is a perspective view of an enclosure having an integral grounding member in accordance with one embodiment of the present invention.

With reference now to FIG. 5, a perspective view of an enclosure 500 of one embodiment of the present invention is shown. Enclosure 500 of the present embodiment is, for example, the top casing of a computer peripheral device. That is, enclosure 500 is configured to be coupled to substrate 100 of, for example, FIG. 1. In so doing, enclosure 500 comprises the cover of the computer peripheral device formed by components (e.g. 104, 106, and 108) disposed on substrate 100 of FIG. 1. Although enclosure 500 is cited as being the top casing of a computer peripheral device in the present embodiment, the present invention is also well suited to having enclosure 500 comprise the base or "bottom casing" of a computer peripheral device.

As shown in FIG. 5, enclosure 500 has a grounding member 502 formed integral therewith. In the present embodiment, enclosure 500 further includes a conductive region 504 to which integral grounding member 502 is electrically coupled. In the embodiment of FIG. 5, conductive region 504 is comprised of the edge portion of enclosure 500. Further, in the present embodiment, conductive region 504 is integral with enclosure 500. That is, conductive region 504 forms a part of enclosure 500. The present invention is also well suited to an embodiment in which the conductive region is comprised, for example, of a conductive plate which is coupled to enclosure 500 and which is electrically coupled to integral grounding member 502. Although conductive region 504 is disposed along the edge portion of the enclosure 500 in the present embodiment, the present invention is also well suited to an embodiment in which conductive region 504 is located elsewhere on enclosure 500. Additionally, in the present embodiment, enclosure 500 also includes a region 506 which is not conductive. In the present embodiment, region 506 is, for example, a plastic region. Although such material is recited as forming region 506 of the present embodiment, the present invention is also well suited to an embodiment in which the region 506 is formed of material other than plastic.

Referring still to FIG. 5, in the present embodiment, grounding member 502 is comprised of a compliant tab, which extends under the bottom edge of enclosure 500. More specifically, integral grounding member 502 is adapted to be resiliently coupled to a ground signal receptacle location such as, for example, ground signal receptacle location 102 of FIG. 1. That is, integral grounding member 502 is disposed on enclosure 500 such that integral grounding member 502 will be electrically coupled to ground signal receptacle location 102 when enclosure 500 is assembled to substrate 100. (During typical assembly, a first casing such as enclosure 500 is coupled to one side of substrate 100, and a second casing is attached to the other side of substrate 100 so as to protectively cover both sides of substrate 100.) In so doing, ground signal receptacle location 102 will be electrically coupled to conductive region 504 via integral grounding member 502. As a result, the comparatively large surface area of conductive region 504 will assist in the dissipation of ground signals from the components (e.g. 104, 106, and 108) of substrate 100. Furthermore, in the present embodiment, integral grounding member 502 is actually compressed against ground signal receptacle location 102 so as to create a reliable physical and electrical connection.

With reference still to FIG. 5, the present invention is particularly beneficial in applications such as compact form factor I/O cards where only a limited number of dedicated ground pins are available. Hence, the present invention improves ground signal dissipation by providing a comparatively large ground plane (e.g. conductive region 504) which is coupled by an integral grounding member (e.g. integral grounding member 502) to a ground signal receptacle location (e.g. ground signal receptacle location 102 of FIG. 1). Therefore, the present invention effectively dissipates ground signals without requiring more than the two dedicated ground signal pins allotted to conventional compact computer peripheral devices.

With reference again to FIG. 5, as yet another advantage, the present invention accomplishes the task of coupling conductive region 504 to ground signal receptacle location 102 of FIG. 1, without requiring costly, labor intensive manual operations that are likely to result in widely varying finished product quality, in terms of EMI effectiveness. That is, enclosure 500 and integral grounding member 502 are fabricated without requiring the numerous parts and costly labor associated with prior art devices.

Referring yet again to FIG. 5, during normal operation, a user of a computer peripheral device will typically grasp the computer peripheral device in the region depicted by bracket 508. As a result, the area at region 508 is commonly subjected to rigorous compression, shock, and torque forces. In the present embodiment, however, integral grounding member 502 is disposed in a location where it will not be subjected to the aforementioned harsh handling forces. As a result, the physical and, hence, the electrical connection between integral grounding member 502 and ground signal receptacle location 102 is not compromised or degraded by repeated handling and use.

Figure 6:
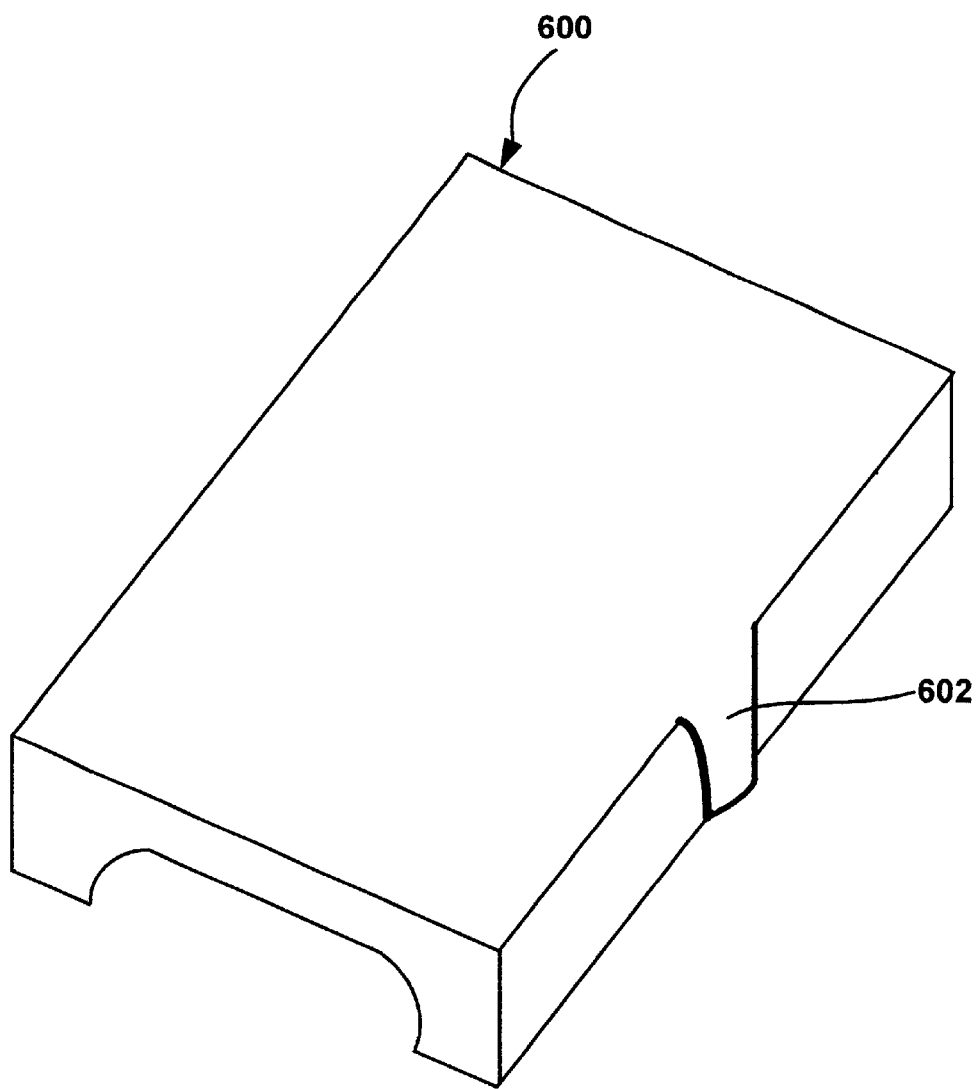
FIG. 6 is a perspective view of a conductive enclosure having an integral grounding member in accordance with one embodiment of the present invention.

With reference now to FIG. 6, a perspective view of an enclosure 600 of another embodiment of the present invention is shown. As with enclosure 500 of FIG. 5, enclosure 600 of the present embodiment is, for example, the top casing of a computer peripheral device. That is, enclosure 600 is configured to be coupled to substrate 100 of, for example, FIG. 1. In so doing, enclosure 600 comprises the cover of the computer peripheral device formed by components (e.g. 104, 106, and 108) disposed on substrate 100 of FIG. 1. Although enclosure 600 is cited as being the top casing of a computer peripheral device in the present embodiment, the present invention is also well suited to having enclosure 600 comprise the base or "bottom casing" of a computer peripheral device.

As shown in FIG. 6, enclosure 600 has a grounding member 602 formed integral therewith. In the present embodiment, enclosure 600 is comprised of electrically conductive material. In this embodiment, enclosure 600 is comprised of copper. The present embodiment is, however, well suited to having enclosure 600 formed of various other material.

Referring still to FIG. 6 in the present embodiment, grounding member 602 is comprised of a compliant tab, which extends under the bottom edge of enclosure 600. More specifically, integral grounding member 602 is adapted to be resiliently coupled to a ground signal receptacle location such as, for example, ground signal receptacle location 102 of FIG. 1. That is, integral grounding member 602 is disposed on enclosure 600 such that integral grounding member 602 will be electrically coupled to ground signal receptacle location 102 when enclosure 600 is assembled to substrate 100. In so doing, ground signal receptacle location 102 will be electrically coupled to conductive enclosure 600 via integral grounding member 602. As a result, the comparatively large surface area of conductive enclosure 600 will assist in the dissipation of ground signals from the components (e.g. 104, 106, and 108) of substrate 100.

Figure 7:
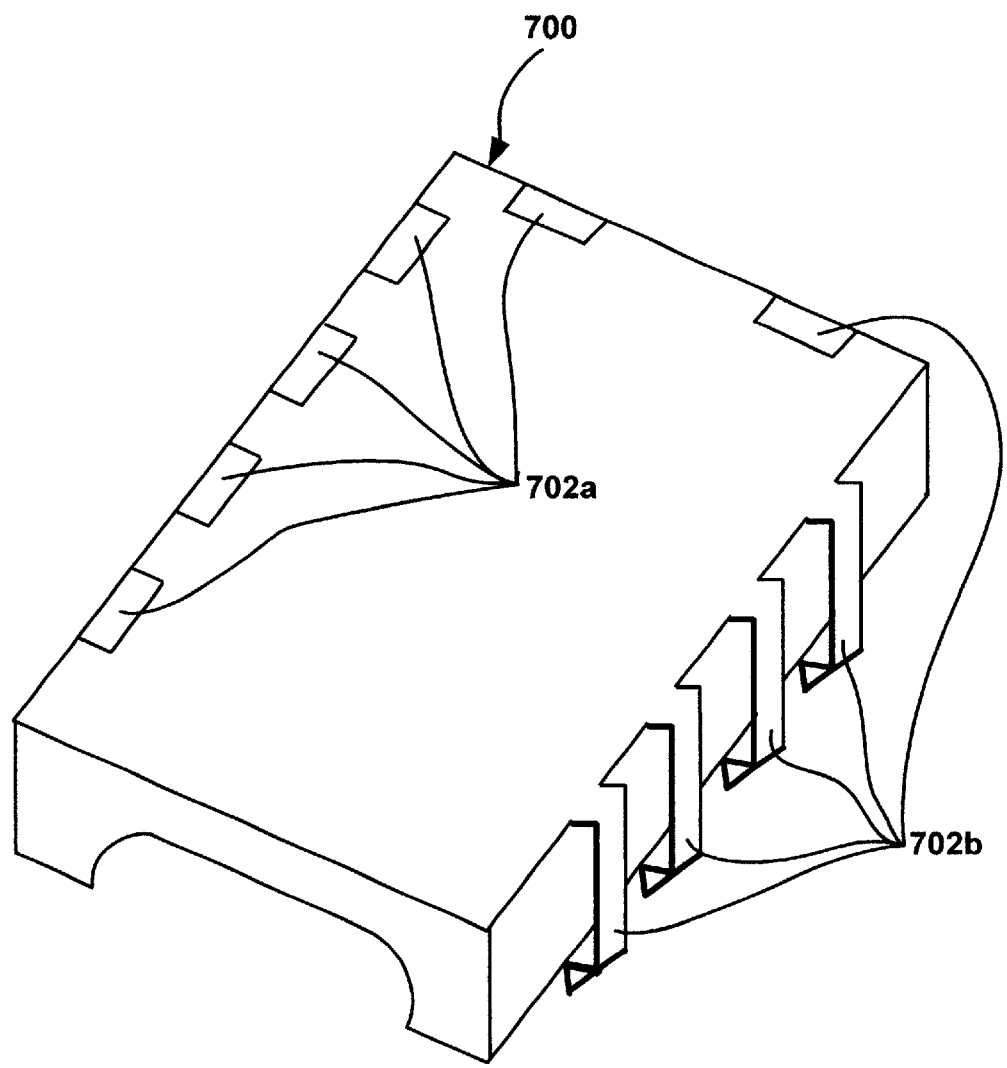
FIG. 7 is a perspective view of a conductive enclosure having a plurality of integral grounding members in accordance with one embodiment of the present invention.

With reference now to FIG. 7, a perspective view of an enclosure 700 of another embodiment of the present invention is shown. As with enclosure 500 of FIG. 5, enclosure 700 of the present embodiment is, for example, the top casing of a computer peripheral device. That is, enclosure 700 is configured to be coupled to substrate 100 of, for example, FIG. 2. In so doing, enclosure 700 comprises the cover of the computer peripheral device formed by components (e.g. 104, 106, and 108) disposed on substrate 100 of FIG. 2. Although enclosure 700 is cited as being the top casing of a computer peripheral device in the present embodiment, the present invention is also well suited to having enclosure 700 comprise the base or "bottom casing" of a computer peripheral device.

As shown in FIG. 7 enclosure 700 has a plurality of grounding members 702*a* and 702*b* formed integral therewith. In the present embodiment, enclosure 700 is comprised of electrically conductive material. In this embodiment, enclosure 700 is comprised of copper. The present embodiment is, however, well suited to having enclosure 700 formed of various other material.

Referring still to FIG. 7 in the present embodiment, plurality of integral grounding members 702*a* and 702*b* are comprised of compliant tabs, which extend under the bottom edge of enclosure 700. More specifically, plurality of integral grounding members 702 are adapted to be resiliently coupled to a respective plurality of ground signal receptacle locations such as, for example, ground signal receptacle locations 200*a* and 200*b* of FIG. 2. That is, plurality of integral grounding members 702*a* and 702*b* are disposed on enclosure 700 such that plurality of integral grounding members 702*a* and 702*b* will be electrically coupled to ground signal receptacle locations 200*a* and 200*b* when enclosure 700 is assembled to substrate 100. In so doing, ground signal receptacle locations 200*a* and 200*b* will be electrically coupled to conductive enclosure 700 via plurality of integral grounding members 702*a* and 702*b*. As a result, the comparatively large surface area of conductive enclosure 700 will assist in the dissipation of ground signals from the components (e.g. 104, 106, and 108) of substrate 100.

Figure 8:
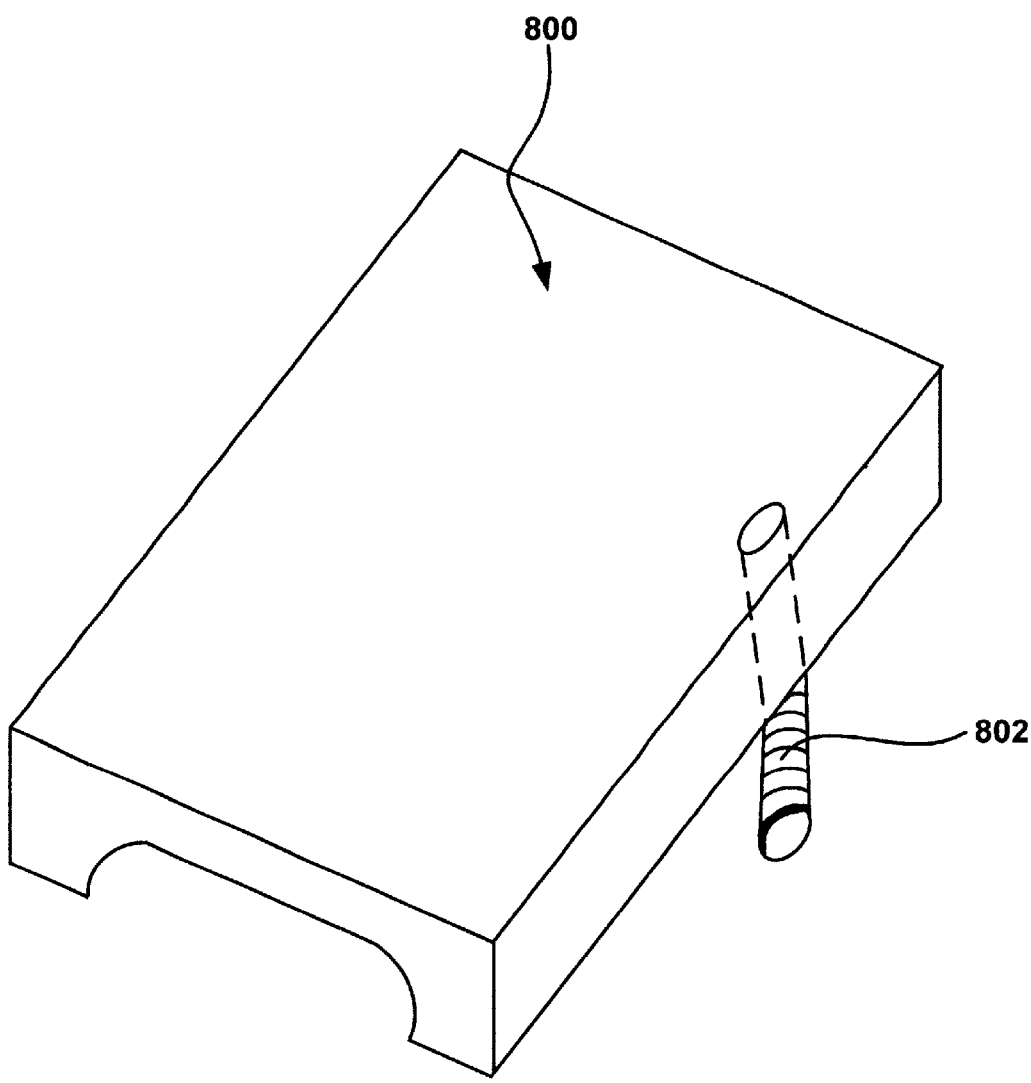
FIG. 8 is a perspective view of a conductive enclosure having an extending pin-type integral grounding member in accordance with one embodiment of the present invention.

With reference now to FIG. 8, a perspective view of an enclosure 800 of another embodiment of the present invention is shown. As with enclosure 500 of FIG. 5, enclosure 800 of the present embodiment is, for example, the top casing of a computer peripheral device. That is, enclosure 800 is configured to be coupled to substrate 100 of, for example, FIG. 3. In so doing, enclosure 800 comprises the cover of the computer peripheral device formed by components (e.g. 104, 106, and 108) disposed on substrate 100 of FIG. 3. Although enclosure 800 is cited as being the top casing of a computer peripheral device in the present embodiment, the present invention is also well suited to having enclosure 800 comprise the base or "bottom casing" of a computer peripheral device.

As shown in FIG. 8 enclosure 800 is comprised of an extending portion adapted to be electrically coupled to through-hole 300. In the present embodiment, enclosure 800 is comprised of electrically conductive material. In this embodiment, enclosure 800 is comprised of copper. The present embodiment is, however, well suited to having enclosure 800 formed of various other material.

Referring still to FIG. 8 in the present embodiment, extending portion integral grounding member 802 is comprised of a pin type appendage, which extends under the bottom edge of enclosure 800. More specifically, extending portion integral grounding member 802 is adapted to be inserted into a respective through-hole ground signal receptacle location such as, for example, through-hole ground signal receptacle locations 300 of FIG. 3. That is, extending portion integral grounding member 802 is disposed on enclosure 800 such that it will be inserted into and electrically coupled to through-hole ground signal receptacle location 300 when enclosure 800 is assembled to substrate 100. In so doing, through-hole ground signal receptacle location 300 will be electrically coupled to conductive enclosure 800 via extending portion integral grounding member 802. As a result, the comparatively large surface area of conductive enclosure 800 will assist in the dissipation of ground signals from the components (e.g. 104, 106, and 108) of substrate 100.

Figure 9:
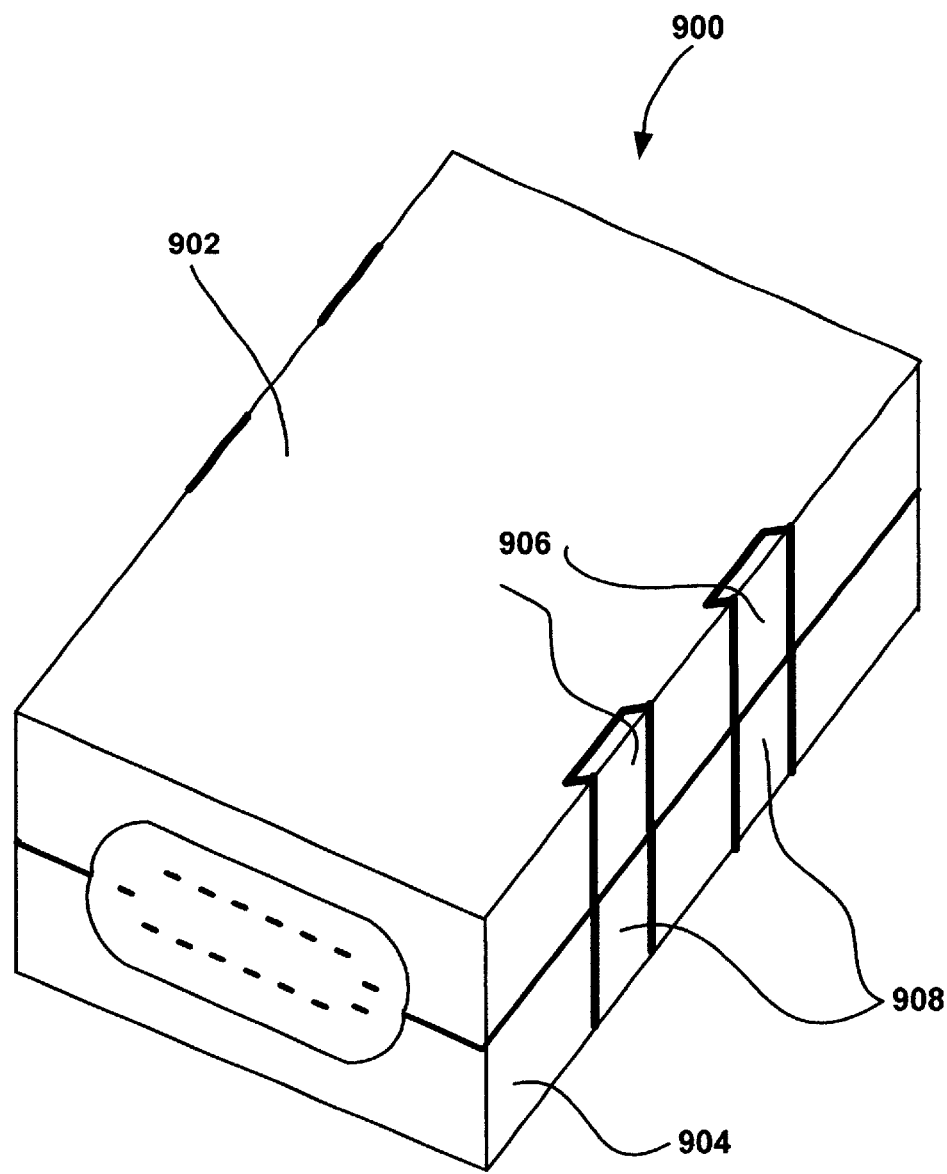
FIG. 9 is a perspective view of a computer peripheral device having top enclosure with an integral grounding member coupled to a bottom enclosure having an integral grounding member in accordance with one embodiment of the present invention.

With reference now to FIG. 9, another embodiment of the present invention is shown in which a computer peripheral device 900 is comprised of a first enclosure 902 and a second enclosure 904. In the present embodiment, first enclosure 902 includes integral grounding members 906 which are disposed such that they are electrically coupled to respective ground signal receptacle locations (hidden) when enclosure 902 is assembled to a substrate (hidden). Similarly, second enclosure 904 includes integral grounding members 908 which are disposed such that they are electrically coupled to respective ground signal receptacle locations (hidden) when enclosure 904 is assembled to a substrate (hidden).

Referring still to FIG. 9, in one such embodiment, the substrate (hidden) has ground signal receptacle locations disposed on both the upper and lower surface thereof. After assembly, the ground signal receptacle locations on the upper surface of the substrate will be coupled to integral grounding members 906, and the ground signal receptacle locations on the lower surface of the substrate will be coupled to integral grounding members 908 of the second enclosure. In so doing, the present embodiment effectively dissipates ground signals through both the top enclosure 902 and the bottom enclosure 904.

Figure 10:
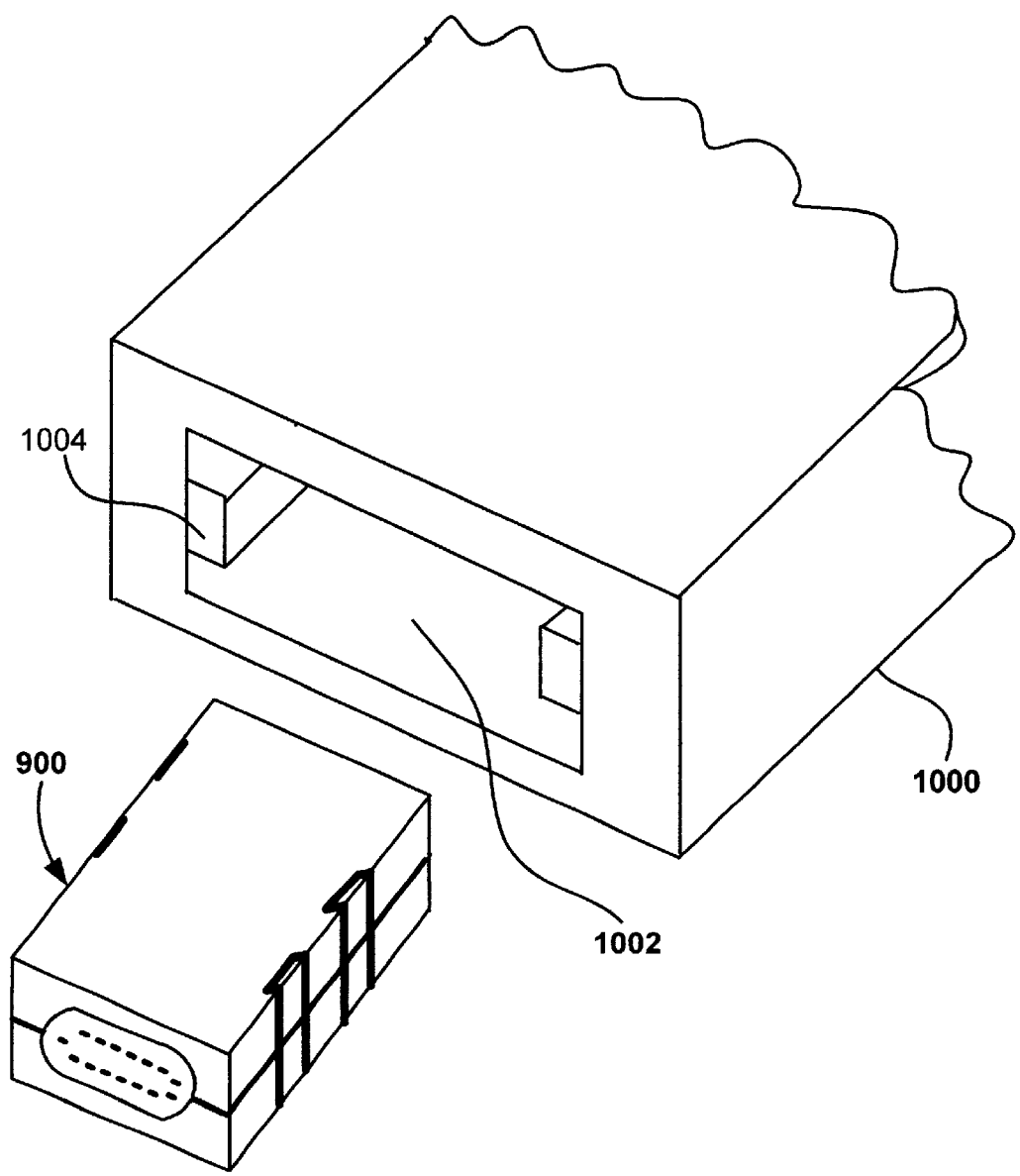
FIG. 10 is a perspective view of a computer system adapted to receive a computer peripheral device in accordance with one embodiment of the present invention.

Referring now to FIG. 10, another embodiment of the present invention is shown in which a computer housing 1000 is adapted to receive a computer peripheral device 900. In the present embodiment, computer housing 1000 has an opening or receptacle 1002 which is adapted to conductively receive computer peripheral device 900. More specifically, computer housing 1000 configured with electrical connectors 1004 which electrically couple computer housing 1000 to computer peripheral device 900 when computer peripheral device 900 is inserted into receptacle 1002 of computer housing 1000. In one embodiment, receptacle 1002 of computer housing 1000 is comprised of a Compact Flash Card slot. In yet another embodiment, receptacle 1002 of computer housing 1000 is comprised of a PC Card slot. Although such specific embodiments are recited here, the present invention is well suited for use with various other types of computer housings and computer housing receptacles.

Thus, the present invention provides a computer communications I/O device structure to effectively dissipate ground signals that does not require more than 2 interface pins dedicated to ground signals. The present invention further provides a computer communications I/O device structure to effectively dissipate ground signals that does not require costly, labor intensive manual operations that are likely to result in widely varying finished product quality, in terms of EMI effectiveness. Additionally, the present invention provides a computer communications I/O device structure which effectively dissipates ground signals, and in which the effectiveness of any ground signal paths used does not degrade relatively rapidly with time, and wherein the device does not violate EMI regulatory requirements when the device is used as intended.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications suited to the particular use contemplated. It is intended that the scope of the invention be defined by the Claims appended hereto and their equivalents.

What is claimed is:

1. An enclosure having a least a conductive region adapted to be coupled to a substrate of a computer peripheral device wherein said substrate includes a ground signal receptacle location, said enclosure further comprising:

a grounding member integral with said enclosure, said grounding member electrically coupled to said conductive region, said grounding member disposed such that said grounding member is electrically coupled to said ground signal receptacle location when said enclosure is assembled to said substrate.

2. The enclosure of claim 1 wherein said enclosure is comprised of electrically conductive material.

3. The enclosure of claim 1 wherein said grounding member is comprised of a compliant tab which is adapted to be resiliently coupled to said ground signal receptacle location.

4. The enclosure of claim 1 wherein said grounding member is comprised of a pin which is adapted to be resiliently coupled to said ground signal receptacle location.

5. The enclosure of claim 1 further comprising a first plurality of said grounding members integral with said enclosure, and a second plurality of said ground signal receptacle locations, said first plurality of said grounding members disposed such that each of said first plurality of said grounding members is electrically coupled to a respective one of said second plurality of said ground signal receptacle locations when said enclosure is assembled to said substrate.

* * * * *